US010013948B2

(12) United States Patent
Lee et al.

(10) Patent No.: US 10,013,948 B2
(45) Date of Patent: Jul. 3, 2018

(54) DISPLAY DEVICE HAVING IMPROVED ELECTROSTATIC DISCHARGE PROTECTION

(71) Applicant: SAMSUNG DISPLAY CO., LTD., Yongin, Gyeonggi-do (KR)

(72) Inventors: Gi Chang Lee, Asan-si (KR); In Soo Wang, Asan-si (KR); Yong Soo Lee, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 192 days.

(21) Appl. No.: 14/876,669

(22) Filed: Oct. 6, 2015

(65) Prior Publication Data

US 2016/0155408 A1 Jun. 2, 2016

(30) Foreign Application Priority Data

Dec. 1, 2014 (KR) .................. 10-2014-0169627

(51) Int. Cl.
*G09G 3/36* (2006.01)
*G09G 5/00* (2006.01)
(Continued)

(52) U.S. Cl.
CPC ........... *G09G 5/003* (2013.01); *G02F 1/1345* (2013.01); *G02F 1/136204* (2013.01);
(Continued)

(58) Field of Classification Search
CPC G09G 5/003; G09G 3/20; G09G 3/36; G09G 5/00; H01L 27/0228;
(Continued)

(56) References Cited

U.S. PATENT DOCUMENTS

2008/0123004 A1  5/2008  Lin et al.
2009/0262094 A1* 10/2009  Lin .................. G06F 3/045
                                                        345/174
(Continued)

FOREIGN PATENT DOCUMENTS

EP          0772073 A1    5/1997
JP       2001-135897 A    5/2001
(Continued)

OTHER PUBLICATIONS

Michael Gartlan, "European Search Report," European Patent Application No. 15196679.3, European Patent Office, dated Jun. 7, 2016, 15 pages, Munich, Germany.

*Primary Examiner* — Pegeman Karimi
(74) *Attorney, Agent, or Firm* — Innovation Counsel, LLP

(57) ABSTRACT

A display device having an electrostatic discharge protection unit disposed between a display unit and a pad unit. The electrostatic discharge protection unit comprises a first signal line configured to deliver data and a control signal from a pad unit to the display unit, a second signal line, a plurality of first electrostatic discharge protection patterns which are electrically connected to the first signal line; and a plurality of second electrostatic discharge protection patterns which are electrically connected to the second signal line. Respective ones of the first electrostatic discharge protection patterns and the second electrostatic discharge protection patterns together form a plurality of electrostatic discharge protection pattern pairs, and the first and second electrostatic discharge protection patterns in each of the electrostatic discharge protection pattern pairs are separated from each other by differing distances.

20 Claims, 10 Drawing Sheets

(51) Int. Cl.
    *H02H 9/04*         (2006.01)
    *G02F 1/1362*     (2006.01)
    *G09G 3/20*         (2006.01)
    *H01L 23/62*      (2006.01)
    *H01L 27/02*      (2006.01)
    *H01T 4/10*         (2006.01)
    *G02F 1/1345*     (2006.01)
    *H05K 1/02*         (2006.01)

(52) U.S. Cl.
    CPC .............. *G09G 3/20* (2013.01); *G09G 3/36* (2013.01); *H01L 23/62* (2013.01); *H01L 27/0288* (2013.01); *H01L 27/0296* (2013.01); *H01T 4/10* (2013.01); *H02H 9/044* (2013.01); *G09G 2300/0426* (2013.01); *G09G 2330/04* (2013.01); *H01L 2924/0002* (2013.01); *H05K 1/0259* (2013.01)

(58) Field of Classification Search
    CPC .. H01L 27/0296; H05K 1/0259; G11C 19/00; G02F 1/1345; G06F 3/038
    USPC ........................................................ 345/211
    See application file for complete search history.

(56) References Cited

U.S. PATENT DOCUMENTS

| | | | |
|---|---|---|---|
| 2010/0165226 A1* | 7/2010 | Lee | G02F 1/133351 349/40 |
| 2011/0057887 A1* | 3/2011 | Lin | G06F 3/044 345/173 |
| 2011/0157071 A1* | 6/2011 | Huang | G06F 3/044 345/174 |
| 2012/0319932 A1 | 12/2012 | Li et al. | |
| 2017/0092639 A1* | 3/2017 | Fan | G06F 3/041 |

FOREIGN PATENT DOCUMENTS

| | | |
|---|---|---|
| JP | 2005-317759 A | 11/2005 |
| JP | 2010-027636 A | 2/2010 |
| KR | 10-2006-0130423 A | 12/2006 |

* cited by examiner

DISPLAY DEVICE HAVING IMPROVED ELECTROSTATIC DISCHARGE PROTECTION

This application claims priority to, and the benefit of, Korean Patent Application No. 10-2014-0169627 filed on Dec. 1, 2014 in the Korean Intellectual Property Office, the disclosure of which is incorporated herein by reference in its entirety.

BACKGROUND OF THE INVENTION

1. Field of the Invention Embodiments of the present invention relate generally to flat panel displays, and more particularly to displays having improved electrostatic discharge protection.

2. Description of the Related Art

With the emergence of the information era, display devices are being rapidly popularized. Many modern display devices are lightweight and thin, and can be driven with low power consumption. Due to these characteristics, the scope of application of such display devices is gradually expanding from televisions, monitors, and notebook computers to mobile phones, personal digital assistants (PDAs) and smartphones.

A display device includes a display unit having a plurality of pixels arranged in a matrix, and a plurality of drivers and a controller for driving the display unit. The display unit includes a plurality of thin-film transistors, and is connected to the drivers and the controller by signal lines and power supply lines.

Depending on the environment in which the display device is used, static electricity can be introduced into the display device along the signal lines and the power supply lines, together with signals. The introduced static electricity can damage elements (e.g., the thin-film transistors) of the display unit.

To protect various elements (e.g., the thin-film transistors of the pixels) of the display device from this introduced static electricity, electrostatic discharge protection patterns may be formed in an area into which signals are introduced (refer to Japanese Patent No. 2001-135897, hereby incorporated by reference). However, these electrostatic discharge protection patterns are deformed by, e.g., an exposure process, and the deformed electrostatic discharge protection patterns may have reduced electrostatic discharge protection efficiency.

SUMMARY OF THE INVENTION

Aspects of the present invention provide a display device having improved electrostatic discharge protection efficiency even after an exposure process.

However, aspects of the present invention are not restricted to the ones set forth herein. The above and other aspects of the present invention will become more apparent to one of ordinary skill in the art to which the present invention pertains by referencing the detailed description of the present invention given below.

According to an embodiment of present invention, a display device may include a display unit having a plurality of pixels configured to display an image, a pad unit configured to receive data and a control signal from an external source such that an image is displayed on the display unit and an electrostatic discharge protection unit disposed between the display unit and the pad unit. The electrostatic discharge protection unit comprises a first signal line configured to deliver the data and the control signal received from the pad unit to the display unit, a second signal line, a plurality of first electrostatic discharge protection patterns which are electrically connected to the first signal line and a plurality of second electrostatic discharge protection patterns which are electrically connected to the second signal line. Respective ones of the first electrostatic discharge protection patterns and the second electrostatic discharge protection patterns together form a plurality of electrostatic discharge protection pattern pairs, and the first and second electrostatic discharge protection patterns in each of the electrostatic discharge protection pattern pairs are separated from each other by different distances.

According to another embodiment of the present invention, a display device may include a display area having a plurality of pixels configured to display an image, and a non-display area which surrounds the display area. The non-display area comprises a signal delivering line configured to receive data and a control signal from an external source, and to deliver the data and the control signal to the display area; a ground line; and a plurality of electrostatic discharge protection pattern pairs which are electrically connected to the signal delivering line and the ground line. Electrostatic discharge protection patterns in at least one of the electrostatic discharge protection pattern pairs are connected to each other so as to form a single electrostatic discharge protection pattern.

These and other aspects and characteristics of the present invention will be described in or will become apparent from the following description of example embodiments.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
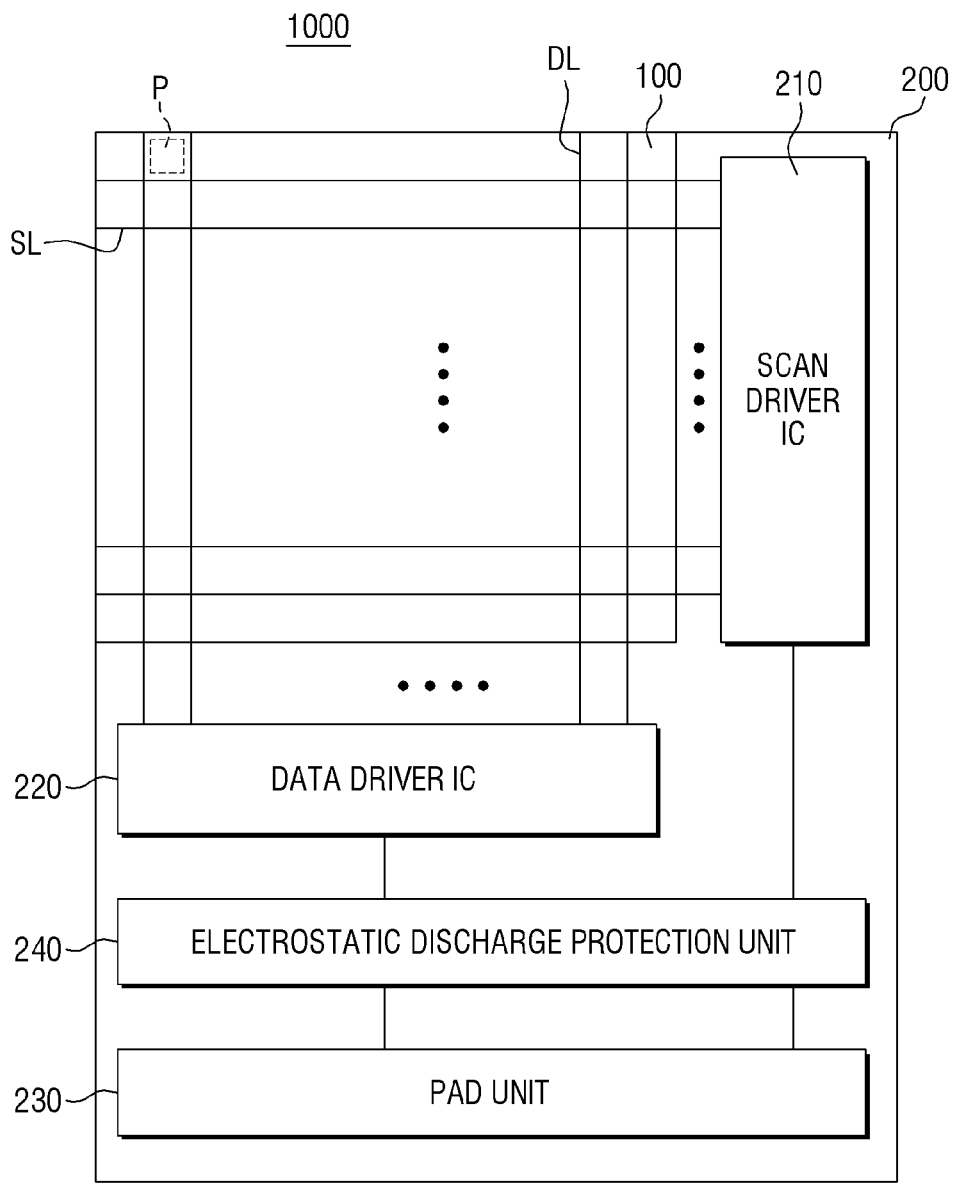
FIG. 1 is a diagram schematically illustrating a display device according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The various Figures are not to scale. All numerical values are approximate, and may vary. All examples of specific materials and compositions are to be taken as nonlimiting and exemplary only. Other suitable materials and compositions may be used instead.

Hereinafter, embodiments of the present invention will be described with reference to the attached drawings.

FIG. 1 is a diagram schematically illustrating a display device 1000 according to an embodiment of the present invention.

Referring to FIG. 1, the display device 1000 according to the current embodiment may include a display area 100 and a non-display area 200.

In the display area 100, a plurality of scan lines SL and a plurality of data lines DL are arranged in a matrix to receive scan driving control signals and data driving control signals from the non-display area 200. In addition, a plurality of pixels P is disposed in regions defined by the scan lines SL and the data lines DL. Each of the pixels PX may include a switching element (e.g., a thin-film transistor) which is turned on or off by a scan driving control signal or a data driving control signal, and a light-emitting element which emits light under the control of the switching element. An image may be displayed when the light-emitting elements emit light.

The non-display area 200 surrounds the display area 100 and is an area in which no image is displayed. The non-display area 200 may include a scan driver integrated circuit (IC) 210, a data driver IC 220, a pad unit 230, and an electrostatic discharge protection unit 240.

The scan driver IC 210 may receive a control signal from an external source, convert the control signal into a plurality of scan driving control signals, and transmit the scan driving control signals to the scan lines SL arranged in the display area 100.

The data driver IC 220 may receive a data image signal R, G, B from an external source, convert the data image signal R, G, B into a plurality of image data signals, and transmit the image data signals to the data lines DL arranged in the display area 100.

The pad unit 230 may be disposed on the periphery of the non-display area 200. The pad unit 230 may receive the data image signal R, G, B and the control signal from the external source(s) and transmit the data image signal R, G, B and the control signal to the scan driver IC 210 and the data driver IC 220. The pad unit 230 may include a plurality of pads, and the pads may be connected one-to-one to a plurality of signal lines arranged in the non-display area 200 to deliver the data image signal R, G, B and the control signal to the scan driver IC 210 and the data driver IC 220. In FIG. 1, the pad unit 230 delivers signals received from the external source to the scan driver IC 210 and the data driver IC 220. However, the present invention is not limited thereto, and for example, an additional pad unit 230 can be formed under the scan driver IC 210.

The electrostatic discharge protection unit 240 may be disposed between the scan driver IC 210 or the data driver IC 220 and the pad unit 230. The electrostatic discharge protection unit 240 may remove an electrostatic signal that can be introduced when the data image signal R, G, B and the control signal are received from the external source. In FIG. 1, the electrostatic discharge protection unit 240 is located between the data driver IC 220 and the pad unit 230. However, embodiments of the present invention are not limited thereto, and for example, an additional electrostatic discharge protection unit 240 can be disposed between the scan driver IC 210 and pad unit 230.

Figure 2:
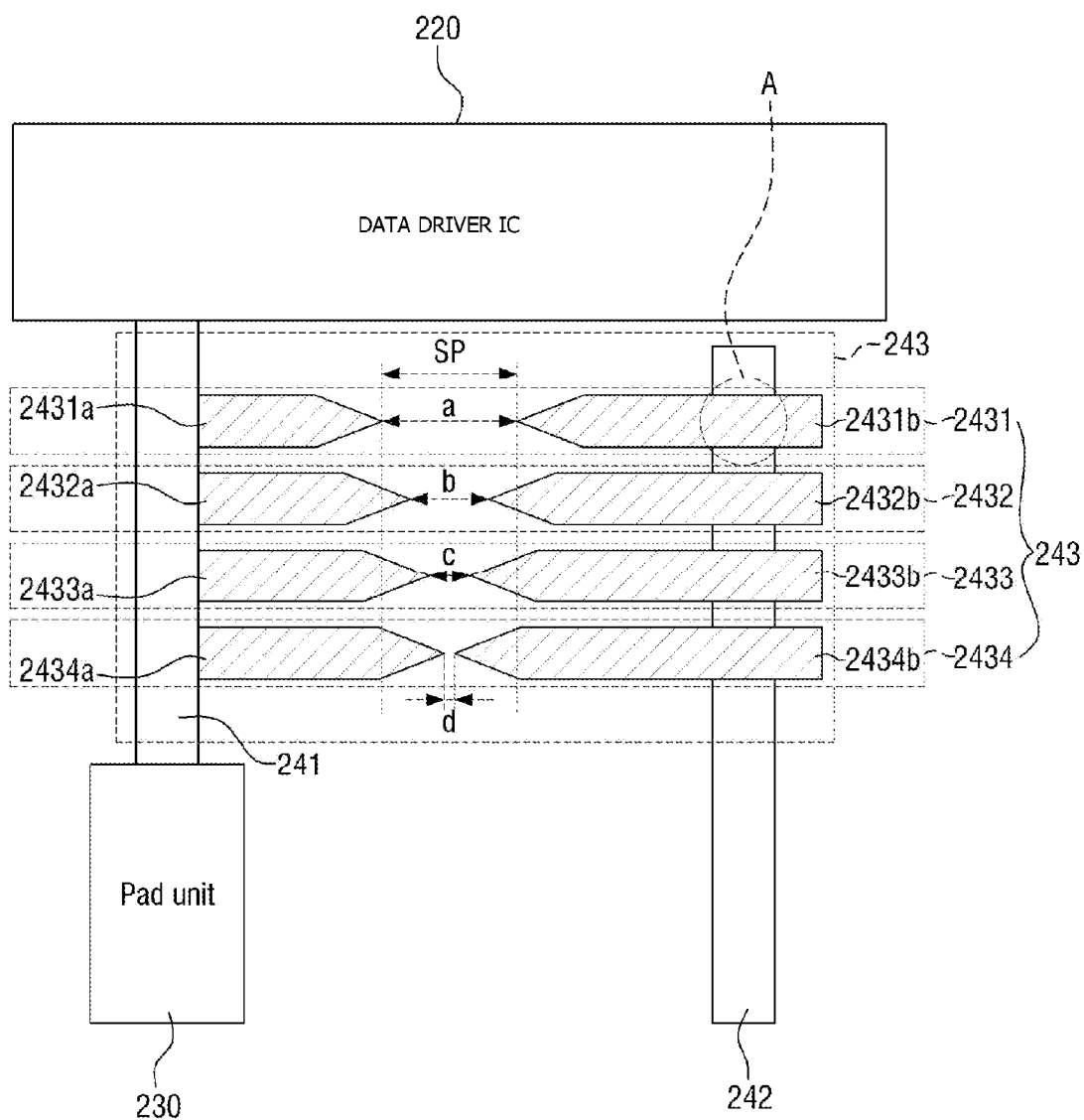
FIG. 2 is a diagram schematically illustrating an electrostatic discharge protection unit of the display device of FIG. 1.
Figure 3:
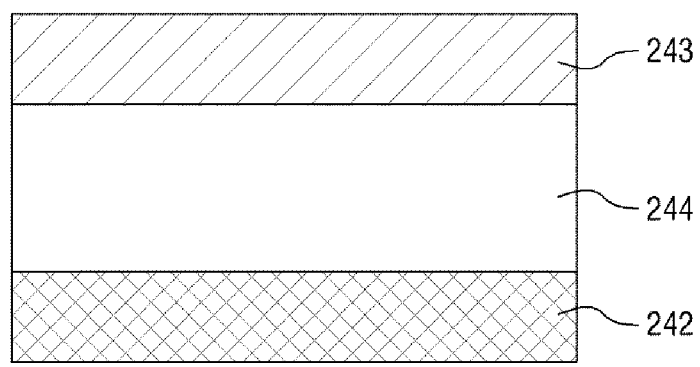
FIG. 3 is a diagram schematically illustrating a cross-section of region 'A' of FIG. 2.

FIG. 2 is a diagram schematically illustrating the electrostatic discharge protection unit 240 of the display device 1000 of FIG. 1. FIG. 3 is a diagram schematically illustrating a cross-section of region 'A' of FIG. 2.

Referring to FIG. 2, the electrostatic discharge protection unit 240 according to the current embodiment may include a first signal line 241, a second signal line 242, and a plurality of electrostatic discharge protection patterns 243.

One or more first signal lines 241 may be provided between the pad unit 230 and the scan driver IC 210 and/or the pad unit 230 and the data driver IC 220. The first signal lines 241 may be arranged in the non-display area 200 to deliver the data image signal R, G, B and the control signal received from the external source to the scan driver IC 210 and the data driver IC 220.

The second signal line 242 may be disposed between any of the first signal lines 241 or outside and, if desired, adjacent to any grouping of the first signal lines 241. The second signal line 242 may be a ground line. Accordingly, an electrostatic signal may be discharged through the second signal line 242 (i.e., the ground line), so that it is not introduced into the display area 100. In addition, the second signal line 242 may form a capacitor having a ground effect, together with electrostatic discharge protection patterns. This will be described in more detail with reference to FIG. 3.

The electrostatic discharge protection patterns 243 may include a plurality of first electrostatic discharge protection patterns 2431*a* through 2434*a* which are disposed on the first signal line 241 or protrude from the first signal line 241, and a plurality of second electrostatic discharge protection patterns 2431*b* through 2434*b* which are disposed on the second signal line 242 or protrude from the second signal line 242. Each of the first electrostatic discharge protection patterns 2431*a* through 2434*a* and the second electrostatic discharge protection patterns 2431*b* through 2434*b* may have a sharp, pointed or needle-shaped end. Each of the first electrostatic discharge protection patterns 2431*a* through 2434*a* and each of the second electrostatic discharge protection patterns 2431*b* through 2434*b* may form a pair and may be placed such that the needle-shaped ends face each other. For example, a first electrostatic discharge protection pattern pair 2431 may be composed of a $(1-1)^{th}$ electrostatic discharge protection pattern 2431*a* and a $(2-1)^{th}$ electrostatic discharge protection pattern 2431*b*, a second electrostatic discharge protection pattern pair 2432 may be composed of a $(1-2)^{th}$ electrostatic discharge protection pattern 2432*a* and a $(2-2)^{th}$ electrostatic discharge protection pattern 2432*b*, a third electrostatic discharge protection pattern pair 2433 may be composed of a $(1-3)^{th}$ electrostatic discharge protection pattern 2433*a* and a $(2-3)^{th}$ electrostatic discharge protection pattern 2433*b*, and a fourth electrostatic discharge protection pattern pair 2434 may be composed of a $(1-4)^{th}$ electrostatic discharge protection pattern 2434*a* and a $(2-4)^{th}$ electrostatic discharge protection pattern 2434*b*.

The first and second electrostatic discharge protection patterns in each of the first through fourth electrostatic discharge protection pattern pairs 2431 through 2434 may be separated by a different distance. For example, the $(1-1)^{th}$ electrostatic discharge protection pattern 2431*a* and the $(2-1)^{th}$ electrostatic discharge protection pattern 2431*b* in the first electrostatic discharge protection pattern pair 2431 may be separated by a distance a, the $(1-2)^{th}$ electrostatic discharge protection pattern 2432*a* and the $(2-2)^{th}$ electrostatic discharge protection pattern 2432*b* in the second electrostatic discharge protection pattern pair 2432 may be separated by a distance b, the $(1-3)^{th}$ electrostatic discharge protection pattern 2433*a* and the $(2-3)^{th}$ electrostatic discharge protection pattern 2433*b* in the third electrostatic discharge protection pattern pair 2433 may be separated by a distance c, and the $(1-4)^{th}$ electrostatic discharge protection pattern 2434*a* and the $(2-4)^{th}$ electrostatic discharge protection pattern 2434*b* in the fourth electrostatic discharge protection pattern pair 2434 may be separated by a distance d. Here, the distance between the first and second electrostatic discharge protection patterns in each of the first through fourth electrostatic discharge protection pattern pairs 2431 through 2434 may be within an exposure space reference distance range SP and may increase with distance from the pad unit 230, that is, in the order of a>b>c>d.

Each of the electrostatic discharge protection patterns 243 may be made of a metal material. In particular, the second electrostatic discharge protection patterns 2431*b* through 2434*b* may serve as one capacitor together with the second signal line 242. In this case, the second signal line 242 may not be a ground line, and the second electrostatic discharge protection patterns 2431*b* through 2434*b* may be formed over the second signal line 242. More specifically, referring to FIG. 3 which is an enlarged cross-sectional view of the region 'A' of FIG. 2, an insulating material 244 such as oxide or nitride may be deposited on the second signal line 242. Then, a metal material for forming the electrostatic discharge protection patterns 243 (i.e., the second electrostatic discharge protection patterns 2431*b* through 2434*b*) may be coated on the insulating material 244 and then patterned to form the electrostatic discharge protection patterns 243.

The electrostatic discharge protection patterns 243 thus formed may be deformed by an exposure process. More specifically, the distance between the first and second electrostatic discharge protection patterns in each of the first through fourth electrostatic discharge protection pattern pairs 2431 through 2434 may be altered by the exposure process. This will now be described in more detail with reference to FIG. 4.

Figure 4:
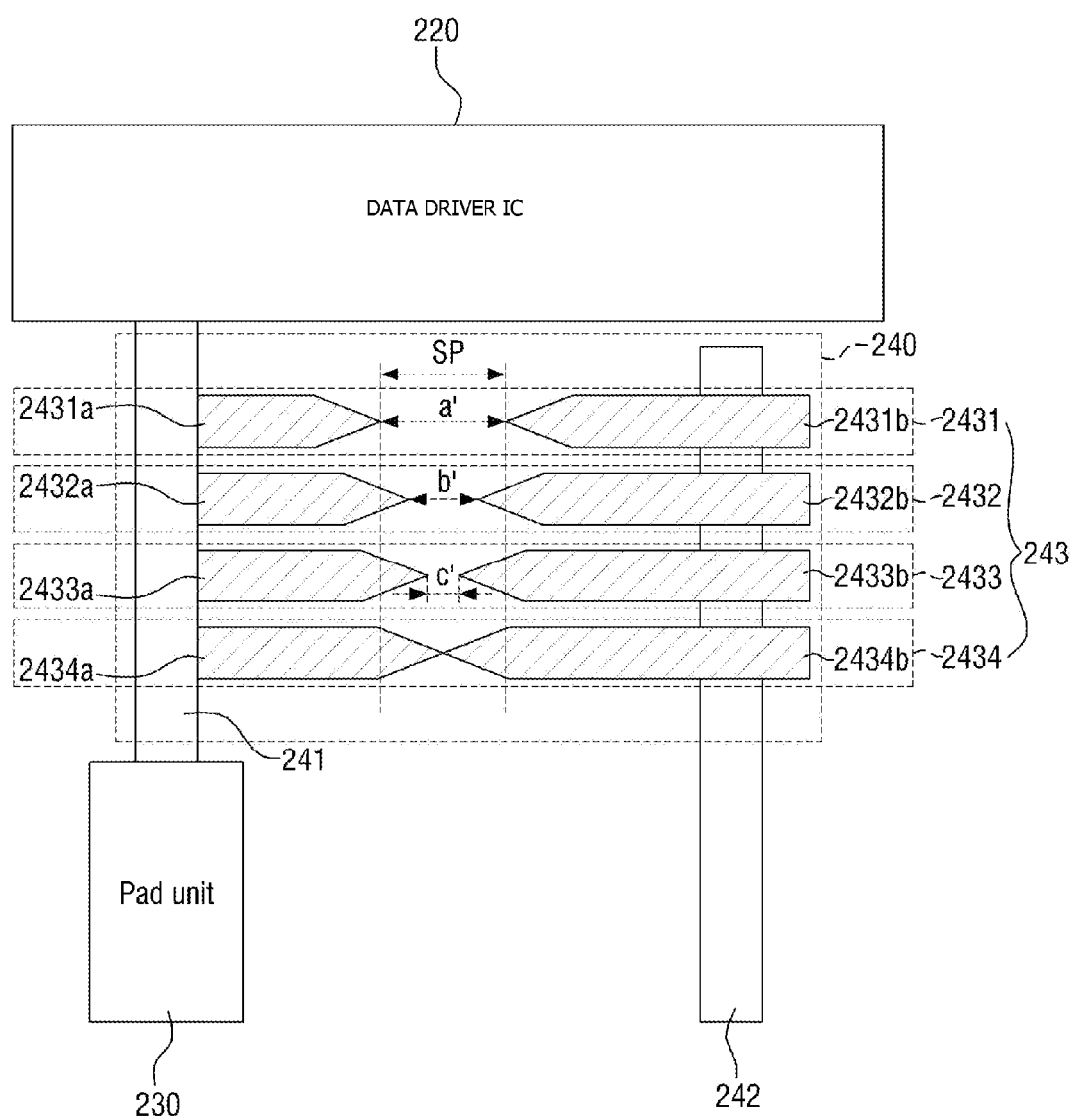
FIG. 4 is a diagram schematically illustrating the electrostatic discharge protection unit of FIG. 2 as altered by an exposure process.

FIG. 4 is a diagram schematically illustrating the electrostatic discharge protection unit 240 of FIG. 2 as altered by an exposure process.

Referring to FIG. 4, the distance between the first and second electrostatic discharge protection patterns in each of the first through fourth electrostatic discharge protection pattern pairs 2431 through 2434 is altered by the exposure process. For example, the distance between the first and second electrostatic discharge protection patterns 2431*a* and 2431*b* is changed from a to a' by the exposure process, the distance between the first and second electrostatic discharge protection patterns 2432*a* and 2432*b* is changed from b to b' by the exposure process, and the distance between the first and second electrostatic discharge protection patterns 2433*a* and 2433b is changed from c to c' by the exposure process. In addition, the distance between the first and second electrostatic discharge protection patterns 2434a and 2434b is changed from d to zero by the exposure process. As a result, the first and second electrostatic discharge protection patterns 2434a and 2434b are connected to form a single pattern. That is, the distance between the first and second electrostatic discharge protection patterns in each of the first through fourth electrostatic discharge protection pattern pairs 2431 through 2434 is, on the whole, reduced by the exposure process.

In the display device 1000 according to the current embodiment, the first through fourth electrostatic discharge protection pattern pairs 2431 through 2434 are formed, and the first and second electrostatic discharge protection patterns in each of the first through fourth electrostatic discharge protection pattern pairs 2431 through 2434 are separated by a different distance. Therefore, even if the electrostatic discharge protection patterns are deformed by an exposure process, an electrostatic signal (static electricity) introduced can be collected in the space between the electrostatic discharge protection patterns and then discharged toward the second signal line 242. As a result, the electrostatic signal is removed. This will now be described in more detail with reference to FIGS. 5 and 6.

Figure 5:
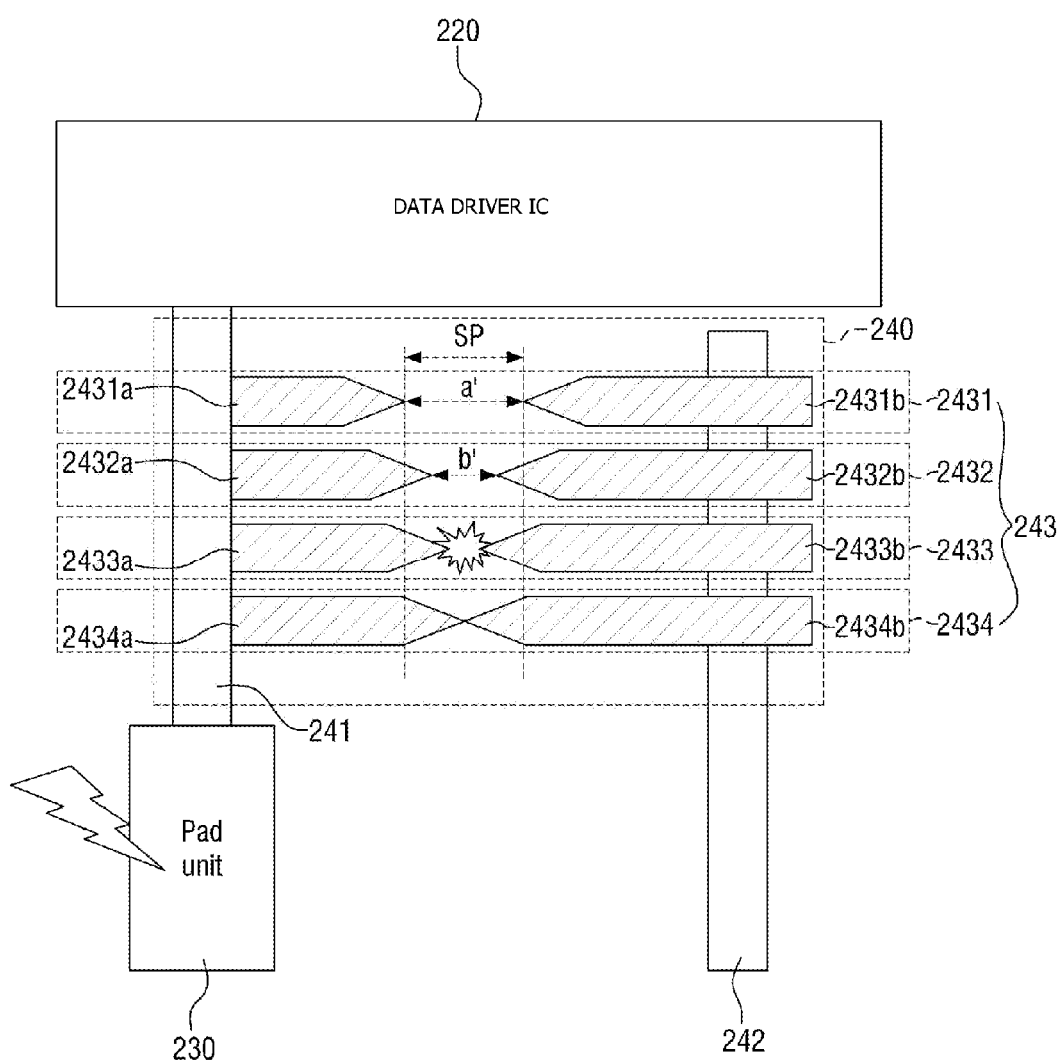
FIGS. 5 and 6 are diagrams schematically illustrating an example of removing static electricity of the display device of FIG. 1.
Figure 6:
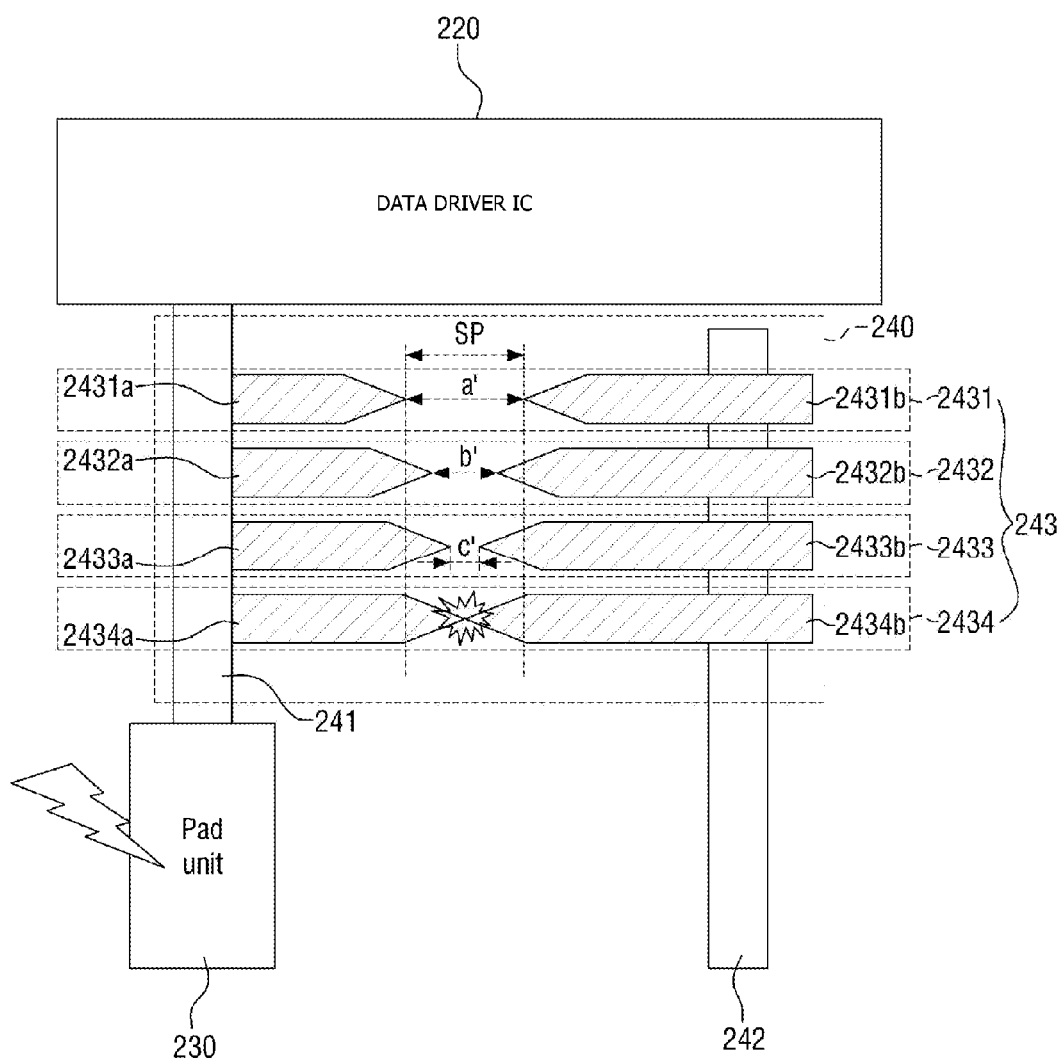

FIGS. 5 and 6 are diagrams schematically illustrating an example of removing static electricity in the display device 1000 of FIG. 1.

Referring to FIG. 5, in the display device 1000 according to the current embodiment, an electrostatic signal (static electricity) introduced through the pad unit 230 disappears in (i.e. shorts through) the third electrostatic discharge protection pattern pair 2433 whose first and second electrostatic discharge protection patterns 2433a and 2433b are separated by a smallest nonzero distance after the exposure process. Further, an electrostatic signal introduced through the pad unit 230 may travel through the fourth electrostatic discharge protection pattern pair 2434 at this time. After the electrostatic signal disappears in the third electrostatic discharge protection pattern pair 2433, if another electrostatic signal is introduced again through the first signal line 241, it may disappear in (short through) the fourth electrostatic discharge protection pattern pair 2434.

Referring to FIG. 6, in the display device 1000 according to the current embodiment, an electrostatic signal (static electricity) introduced through the pad unit 230 may travel through the fourth electrostatic discharge protection pattern pair 2434 instead of the third electrostatic discharge protection pattern pair 2433. This is because the first electrostatic discharge protection pattern 2434a and the second electrostatic discharge protection pattern 2434b in the fourth electrostatic discharge protection pattern pair 2434 are connected by the exposure process. Since the connected portion serves as a resistor, the electrostatic signal introduced to the fourth electrostatic discharge protection pattern pair 2434 may travel through the connected portion. This electrostatic signal may create a discharge in the fourth electrostatic discharge protection pattern pair 2434, disconnecting the electrostatic discharge protection patterns 2434a and 2434b from each other. Then, if another electrostatic signal is introduced through the first signal line 241, it may instead short across the first and second electrostatic discharge protection patterns 2433a and 2433b in the third electrostatic discharge protection pattern pair 2433.

Figure 7:
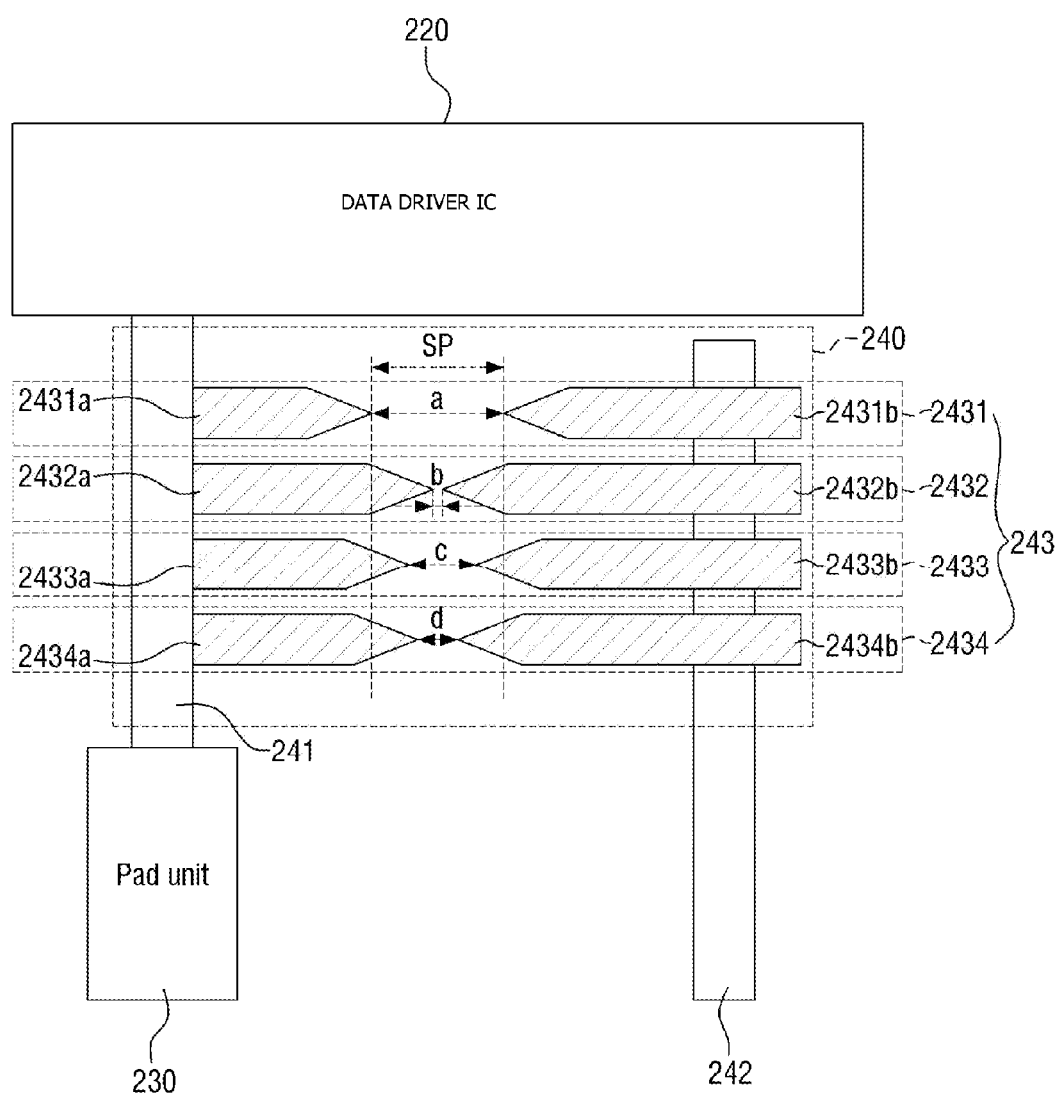
FIGS. 7 through 9 are diagrams schematically illustrating other embodiments of the electrostatic discharge protection unit of the display device of FIG. 1.
Figure 8:
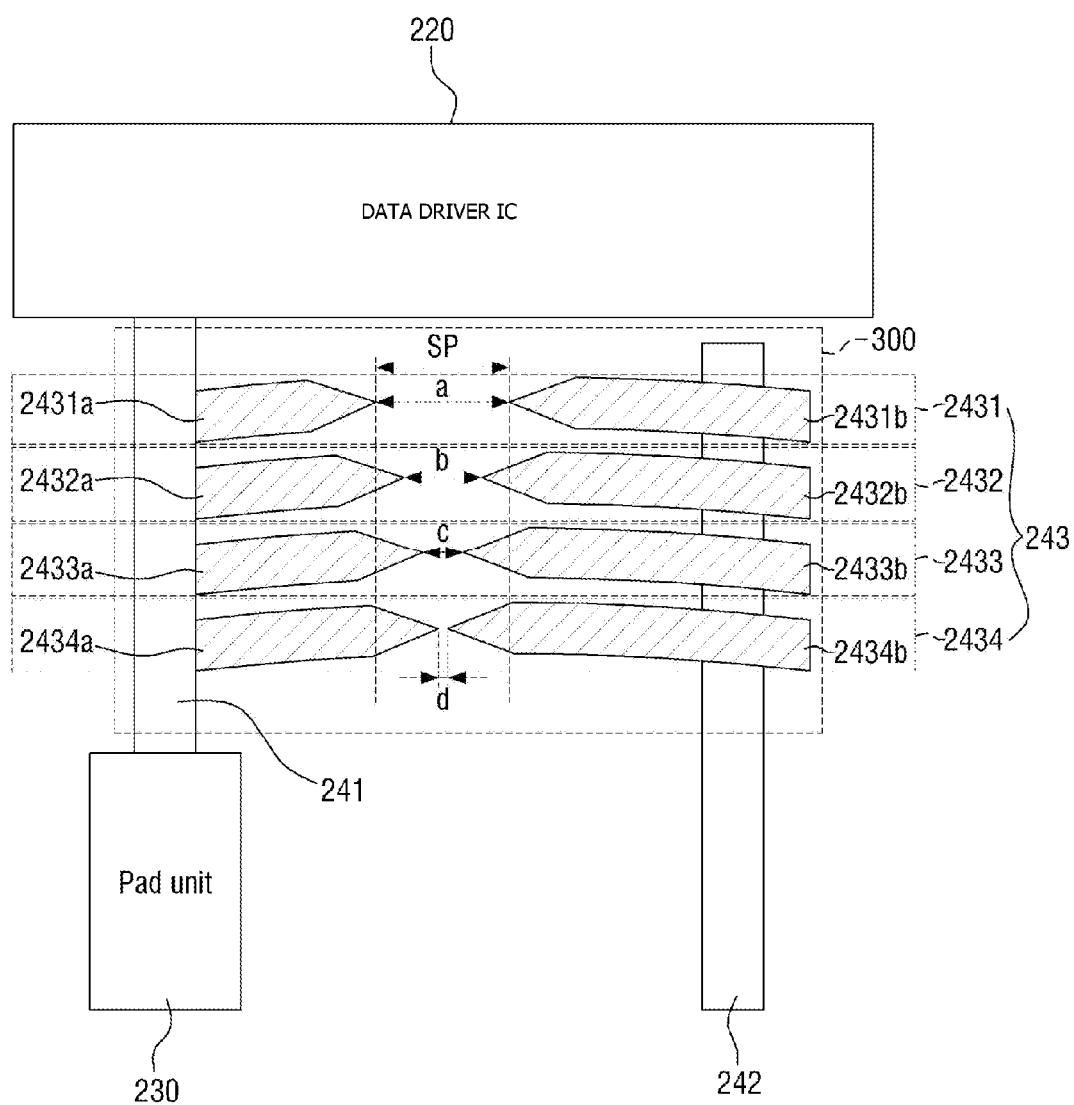
Figure 9:
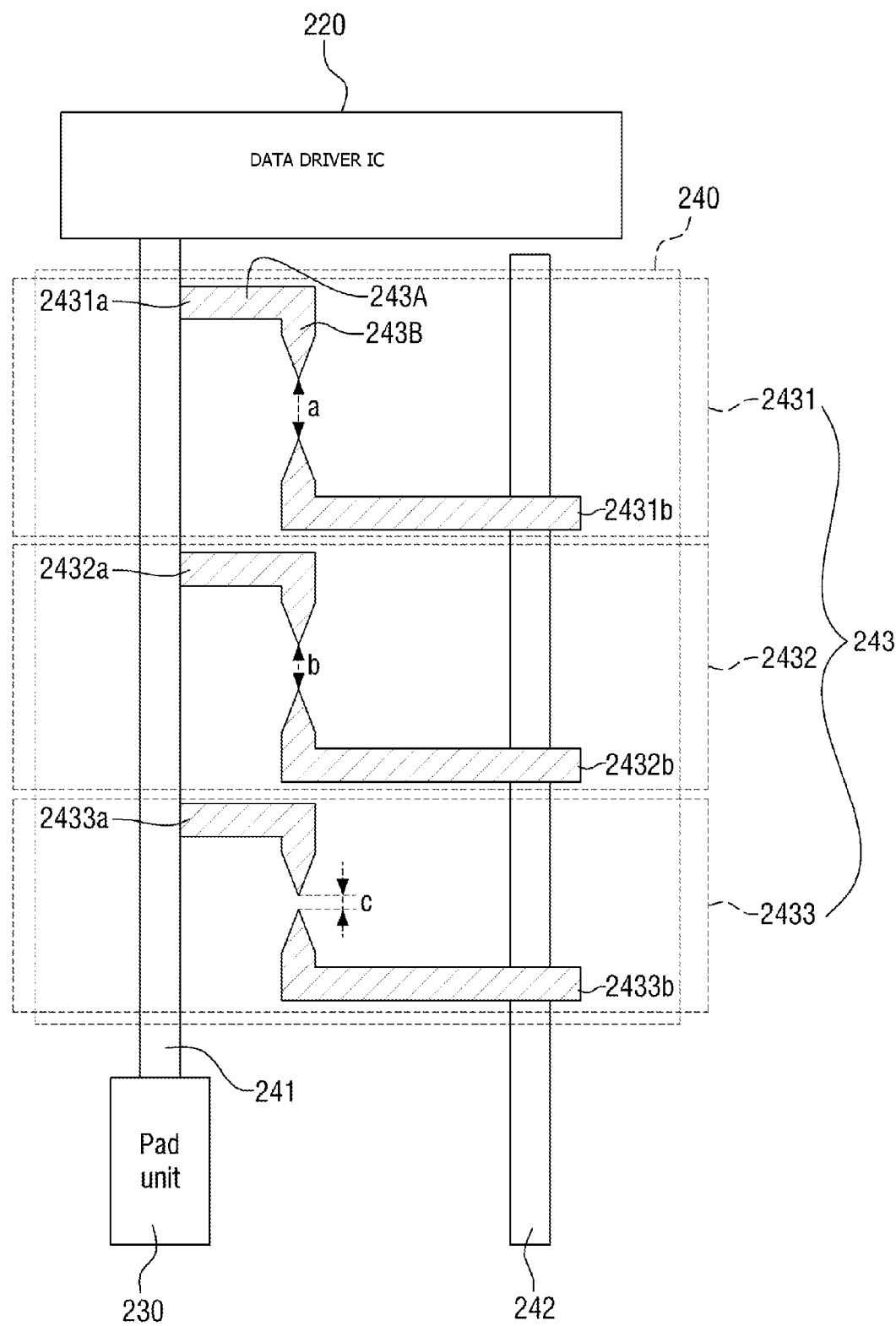

FIGS. 7 through 9 are diagrams schematically illustrating other embodiments of the electrostatic discharge protection unit 240 of the display device 1000 of FIG. 1.

Referring to FIG. 7, an electrostatic discharge protection unit 240 may include a plurality of electrostatic discharge protection patterns 243, and the electrostatic discharge protection patterns 243 may include first through fourth electrostatic discharge protection pattern pairs 2431 through 2434. Here, a distance between first and second electrostatic discharge protection patterns in each of the first through fourth electrostatic discharge protection pattern pairs 2431 through 2434 of FIG. 7 may have a zigzag shape instead of being gradually reduced toward the pad unit 230 as illustrated in FIG. 2. That is, distances between successive first and second electrostatic discharge protection pattern pairs may alternate between smaller and larger values. For example, a distance a between first and second electrostatic discharge protection patterns 2431a and 2431b in the first electrostatic discharge protection pattern pair 2431 may be greater than a distance b between first and second electrostatic discharge protection patterns 2432a and 2432b in the second electrostatic discharge protection pattern pair 2432, a distance c between first and second electrostatic discharge protection patterns 2433a and 2433b in the third electrostatic discharge protection pattern pair 2433 may be greater than the distance b between the first and second electrostatic discharge protection patterns 2432a and 2432b in the second electrostatic discharge protection pattern pair 2432, and a distance d between first and second electrostatic discharge protection patterns 2434a and 2434b in the fourth electrostatic discharge protection pattern pair 2434 may be smaller than the distance c between the first and second electrostatic discharge protection patterns 2433a and 2433b in the third electrostatic discharge protection pattern pair 2433.

If the first through fourth electrostatic discharge protection pattern pairs 2431 through 2434 are formed as described above, an electrostatic signal may short through or arc across the second electrostatic discharge protection pattern pair 2432 whose first and second electrostatic discharge protection patterns 2432a and 2432b are separated by the smallest distance b.

Referring to FIG. 8, an electrostatic discharge protection unit 240 may include first through fourth electrostatic discharge protection pattern pairs 2431 through 2434. The first through fourth electrostatic discharge protection pattern pairs 2431 through 2434 are similar to those of FIG. 2, and thus a detailed description of certain of their aspects is omitted. However, first and second electrostatic discharge protection patterns in each of the first through fourth electrostatic discharge protection pattern pairs 2431 through 2434 may be placed to face each other on a curve, not on a straight line as illustrated in FIG. 2. That is, one or more of the first through fourth electrostatic discharge protection pattern pairs 2431 through 2434 may be shaped as curvilinear, rather than linear or straight, structures. Even in this case, the first and second electrostatic discharge protection patterns in each of the first through fourth electrostatic discharge protection pattern pairs 2431 through 2434 may be separated by a different distance, and an electrostatic signal may short through the fourth electrostatic discharge protection pattern pair 2434 whose first and second electrostatic discharge protection patterns 2434a and 2434b are separated by the smallest distance.

Lastly, referring to FIG. 9, an electrostatic discharge protection unit 240 may include first through third electrostatic discharge protection pattern pairs 2431 through 2433. While first and second electrostatic discharge protection patterns in each electrostatic discharge protection pattern pair are placed to face each other along the same line in the previous embodiments, a plurality of first electrostatic discharge protection patterns 2431a through 2433a disposed on the first signal line 241 and a plurality of second electrostatic discharge protection patterns 2431b through 2433b disposed on the second signal line 242 may be placed on different lines. That is, electrostatic discharge protection pattern pairs 2431 through 2433 may not be placed collinear to each other, but may instead be offset from each other in any manner, with ends of each pair facing each other. Each of the first electrostatic discharge protection patterns 2431a through 2433a and the second electrostatic discharge protection patterns 2431b through 2433b may include a first pattern portion 243A which protrudes from the first signal line 241 or the second signal line 242 toward a region between the first signal line 241 and the second signal line 242, and a second pattern portion 243B which protrudes from the first pattern portion 243A in a direction perpendicular to the first pattern portion 243A and has a sharp needle-shaped or pointed end.

The second pattern portion 243B of each of the first electrostatic discharge protection patterns 2431a through 2433a may protrude perpendicularly downward, and the second pattern portion 243B of each of the second electrostatic discharge protection patterns 2431b through 2433b may protrude perpendicularly upward, such that the sharp needle-shaped ends face each other. In the case of FIG. 9, an electrostatic signal may arc across the third electrostatic discharge protection pattern pair 2433 whose first and second electrostatic discharge protection patterns 2431a and 2431b are separated by the smallest distance.

Figure 10:
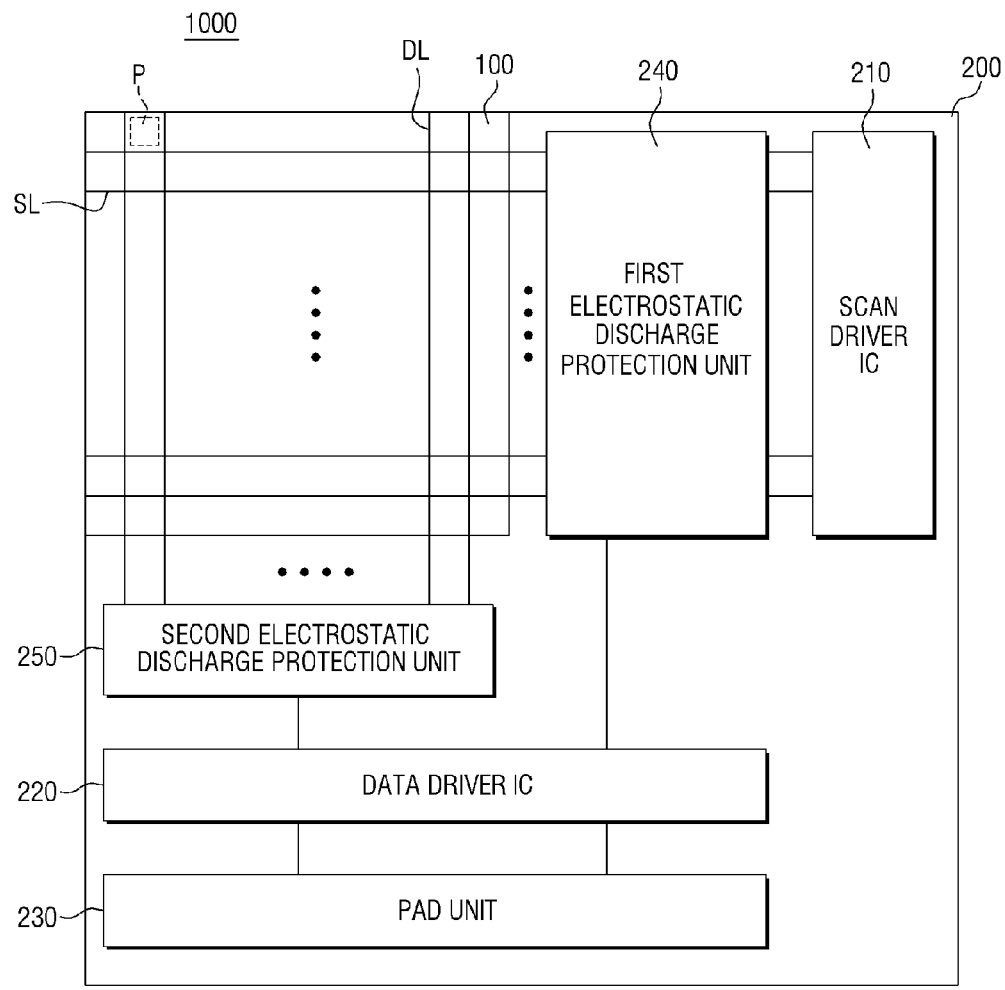
FIG. 10 is a diagram schematically illustrating a display device according to another embodiment of the present invention.

FIG. 10 is a diagram schematically illustrating a display device 1000 according to another embodiment of the present invention.

Referring to FIG. 10, the display device 1000 according to the current embodiment may include a display area 100 and a non-display area 200. The non-display area 200 may include a scan driver IC 210, a data driver IC 220, a pad unit 230, a first electrostatic discharge protection unit 240, and a second electrostatic discharge protection unit 250.

The display device 1000 of FIG. 10 has a similar structure to the display device 1000 of FIG. 1, but is different from the display device 1000 of FIG. 1 in that the first electrostatic discharge protection unit 240 and the second electrostatic discharge protection unit 250 are both disposed in the non-display area 200. Accordingly, a detailed description of the display area 100 and the non-display area 200 will be largely omitted, and only the arrangement of the first electrostatic discharge protection unit 240 and the second electrostatic discharge protection unit 250 will be described.

In the non-display area 200 of the display device 1000 according to the current embodiment, the first electrostatic discharge protection unit 240 may be disposed between the display area 100 and the scan driver IC 210, and the second electrostatic discharge protection unit 250 may be disposed between the display area 100 and the data driver IC 220. The first electrostatic discharge protection unit 240 and the second electrostatic discharge protection unit 250 can prevent the introduction of an electrostatic signal to the display area 100. The first electrostatic discharge protection unit 240 and the second electrostatic discharge protection unit 250 may surround the display area 100 in a kind of guard ring shape. In particular, the first electrostatic discharge protection unit 240 protects each of the scan lines SL from electrostatic signals in the manner described above, while the second electrostatic discharge protection unit 250 protects each of the data lines DL from electrostatic signals in the manner described above. Thus, the protection units 240, 250 protect all signal lines of the display area 100 from electrostatic signals. The shape of each of the first electrostatic discharge protection unit 240 and the second electrostatic discharge protection unit 250 may be the same as any one of the shapes described above with reference to FIGS. 2 through 9, and thus a detailed description thereof is omitted.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein. Furthermore, different features of the various embodiments, disclosed or otherwise understood, can be mixed and matched in any manner to produce further embodiments within the scope of the invention.

What is claimed is:

1. A display device comprising:
   a display unit having a plurality of pixels configured to display an image;
   a data pad configured to receive data signal from an external source, such that an image is displayed on the display unit; and
   an electrostatic discharge protection unit disposed between the display unit and the data pad,
   wherein the electrostatic discharge protection unit comprises:
   a first signal line configured to transmit the data signal received from the data pad to the display unit;
   a second signal line which is disposed adjacent to the first signal line;
   a plurality of first electrostatic discharge protection patterns which are disposed between the data pad and the display unit, and are electrically connected to the first signal line; and
   a plurality of second electrostatic discharge protection patterns which are disposed between the data pad and the display unit, and overlap the second signal line in a plan view,
   wherein respective ones of the first electrostatic discharge protection patterns and the second electrostatic discharge protection patterns together form a plurality of electrostatic discharge protection pattern pairs, and the first and second electrostatic discharge protection patterns in each of the electrostatic discharge protection pattern pairs are separated from each other by differing distances.

2. The display device of claim 1, wherein the first electrostatic discharge protection patterns and the second electrostatic discharge protection patterns are disposed on a same line to form the electrostatic discharge protection pattern pairs, and
   wherein a number of the first electrostatic discharge protection patterns is equal to a number of the second electrostatic discharge protection patterns.

3. The display device of claim 2, wherein each of the first and second electrostatic discharge protection patterns has a pointed end.

4. The display device of claim 3, wherein the first and second electrostatic discharge protection patterns in each of the electrostatic discharge protection pattern pairs are arranged such that the pointed ends face each other.

5. The display device of claim 1, wherein the first electrostatic discharge protection patterns and the second electrostatic discharge protection patterns are disposed on different lines to form the electrostatic discharge protection pattern pairs.

6. The display device of claim 5, wherein each of the first and second electrostatic discharge protection patterns comprises a first pattern portion which protrudes toward a region between the first signal line and the second signal line, and a second pattern portion which protrudes from the first pattern portion in a direction at least approximately perpendicular to the first pattern portion and which has a pointed end.

7. The display device of claim 1, wherein the second signal line is a ground line.

8. The display device of claim 1, further comprising an insulating layer formed between the second signal line and the second electrostatic discharge protection patterns.

9. The display device of claim 1, wherein the first and second electrostatic discharge protection patterns in each of the electrostatic discharge protection pattern pairs are separated by respective distances, each distance falling within an exposure space reference distance range.

10. The display device of claim 1, wherein the first and second electrostatic discharge protection patterns of the electrostatic discharge protection pattern pairs are separated by respective distances, and wherein, for the electrostatic discharge protection pattern pair whose first and second electrostatic discharge protection patterns are separated by the smallest distance, the first and second electrostatic discharge protection patterns are connected to each other so as to form a single electrostatic discharge protection pattern.

11. A display device comprising:
a display area having a plurality of pixels configured to display an image; and
a non-display area which surrounds the display area,
wherein the non-display area comprises:
a signal delivering line connected to a data pad and configured to receive data signal from an external source via the data pad, and to deliver the data signal to the display area;
a ground line; and
a plurality of electrostatic discharge protection pattern pairs which are disposed between the data pad and the display unit, and are electrically connected to the signal delivering line and the ground line,
wherein electrostatic discharge protection patterns in at least one of the electrostatic discharge protection pattern pairs are connected to each other so as to form a single electrostatic discharge protection pattern, and
wherein at least one of the electrostatic discharge protection patterns overlaps the ground line in a plan view.

12. The display device of claim 11, wherein in each of the electrostatic discharge protection pattern pairs excluding the at least one electrostatic discharge protection pattern pair whose electrostatic discharge protection patterns are connected to each other, respective electrostatic discharge protection patterns are separated by differing distances.

13. The display device of claim 12, wherein an electrostatic signal applied to the signal delivering line is transmitted to the ground line through the electrostatic discharge protection pattern pair whose electrostatic discharge protection patterns are separated by the smallest distance.

14. The display device of claim 12, wherein the distances lie within an exposure space reference distance range.

15. The display device of claim 11, wherein each of the electrostatic discharge protection patterns in each of the electrostatic discharge protection pattern pairs has a pointed end.

16. The display device of claim 15, wherein the electrostatic discharge protection patterns in each of the electrostatic discharge protection pattern pairs are arranged such that the pointed ends face each other.

17. The display device of claim 11, wherein each of the electrostatic discharge protection patterns in each of the electrostatic discharge protection pattern pairs comprises a first pattern portion which protrudes from the signal delivering line or the ground line toward a space between the signal delivering line and the ground line, and a second pattern portion which protrudes from the first pattern portion in a direction at least approximately perpendicular to the first pattern portion and which has a pointed end.

18. The display device of claim 11, wherein an electrostatic signal applied to the signal delivering line is transmitted to the ground line through the at least one electrostatic discharge protection pattern pair whose electrostatic discharge protection patterns are connected to each other.

19. The display device of claim 11, further comprising an insulating layer formed between the ground line and a plurality of electrostatic discharge protection patterns electrically connected to the ground line.

20. The display device of claim 11, wherein the single electrostatic discharge protection pattern is formed according to an exposure process.

* * * * *